United States Patent [19]
Lee

[11] Patent Number: 6,127,228
[45] Date of Patent: Oct. 3, 2000

[54] METHOD OF FORMING BURIED BIT LINE

[75] Inventor: Tong-Hsin Lee, Taipei Hsien, Taiwan

[73] Assignees: United Silicon Incorporated; United Microelectronics Corp., both of Hsinchu, Taiwan

[21] Appl. No.: 09/435,399

[22] Filed: Nov. 6, 1999

[51] Int. Cl.$^7$ .................................................. H01L 21/336
[52] U.S. Cl. ........................ 438/262; 438/149; 438/296; 438/672
[58] Field of Search ..................... 438/149, 197, 438/233, 262, 263, 296, 633, 672

[56] References Cited

U.S. PATENT DOCUMENTS

| | | | |
|---|---|---|---|
| 5,702,969 | 12/1997 | Lee | 438/239 |
| 5,753,551 | 5/1998 | Sung | 438/253 |
| 5,830,797 | 11/1998 | Cleeves | 438/296 |
| 5,840,591 | 11/1998 | Park et al. | 438/262 |
| 6,004,835 | 12/1999 | Noble | 438/149 |

*Primary Examiner*—T. N. Quach
*Attorney, Agent, or Firm*—Charles C. H. Wu; Charles C. H. Wu & Associates, APC

[57] ABSTRACT

A method of forming buried bit lines. A silicon-on-insulator (SOI) substrate includes a silicon base layer, a first insulation layer and an epitaxial silicon layer. A shallow trench isolation (STI) layer that contacts the first insulation layer is formed in the epitaxial silicon layer. A trench that penetrates the STI layer and runs deep into the first insulation layer is formed. A buried bit line is formed inside the trench such that the top surface of the buried bit line is located between the upper and the lower surface of the STI layer. A second insulation layer is next formed over the buried bit line such that the top surface of the second insulation layer is at the same level as the top surface of the epitaxial silicon layer. A plurality of word lines and a plurality of source/drain regions are formed over the substrate and in the epitaxial silicon layer. A third insulation layer is formed over the substrate, filling the space between the word lines such that the top surface of the third insulation layer is at the same level as the top surface of the word lines. A self-aligned contact process is carried out to form a bit line contact opening between the word lines. The bit line contact opening exposes the buried bit line and a portion of the source/drain region. Finally, bit line contact is formed in the bit line contact opening.

8 Claims, 6 Drawing Sheets

METHOD OF FORMING BURIED BIT LINE

BACKGROUND OF THE INVENTION

1. Field of the Invention

The present invention relates to a method of manufacturing a semiconductor device. More particularly, the present invention relates to a method of forming a buried bit line.

2. Description of the Related Art

Dynamic random access memory (DRAM) is a type of volatile memory capable of storing a bit of data in each cell through the presence or absence of charges within its capacitor. Since charges stored within a DRAM cell may leak once power is off, data will be lost. In general, a DRAM cell consists of a metal-oxide-semiconductor (MOS) transistor and a capacitor.

FIGS. 1 through 4 are schematic cross-sectional views showing the progression of steps for producing a conventional DRAM unit. First, as shown in FIG. 1, a shallow trench isolation (STI) layer 102 is formed in a substrate 100. A plurality of bit lines 104 is formed over the substrate 100 and the STI layer 102. A plurality of source/drain regions 106 are formed in the substrate 100 between the word lines 104. Insulation material is deposited over the word lines 104 and into the space between the word lines to form an insulation layer 108.

As shown in FIG. 2, photolithographic and etching operations are carried out to form contact openings 110 in the insulation layer 108. The contact openings 110 expose a portion of the source/drain region 106. Conductive material is next deposited into the openings 110 and over the insulation layer 108 to form a conductive layer (not shown). The conductive layer is patterned to form contact pads 112. An insulation layer 114 is formed over the insulation layer 108 and the contact pads 112.

As shown in FIG. 3, photolithographic and etching operations are carried out to form a bit line opening 116 in the insulation layer 114. The bit line opening 116 exposes a portion of the contact pad 112. A bit line 118 that also fills the bit line opening 116 is formed over the bit line opening 116. Hence, the bit line 118 is electrically connected to the contact pad 112. An insulation layer 120 is formed over the insulation layer 114 and the bit line 118.

As shown in FIG. 4, node contact openings 122 are formed in the insulation layer 120. The node contact openings 122 expose a portion of the contact pad 112 not yet electrically connected to any bit line. A node contact 124 is formed inside each node contact opening 122. Capacitors (not shown) are subsequently formed above the substrate 100 to complete the fabrication of a DRAM cell.

In the aforementioned process, the node contact openings are formed after a structure of multiple conductve layers (including word lines and bit lines) isolated from each other by plurality of insulation layers is formed. Consequently, there is a considerable height difference between a peripheral circuit region and a device region in a silicon chip. This often leads to a subsequent planarization problem. Furthermore, as the level of device integration continues to increase, the node contact openings formed after the bit line have a bigger aspect ratio. With a big aspect ratio, node contact openings are more difficult to form, resulting in a node contact with low conductivity and a barrier layer with poor step coverage. Hence, electrical contact of the node contact is poor. To deal with these problems, manufacturers have to use expensive etching equipment and chemical deposition stations. However, this leads to an increase in the cost of production.

SUMMARY OF THE INVENTION

Accordingly, one object of the present invention is to provide a method of forming buried bit lines so that total thickness of all the layers formed within the device region is reduced.

To achieve these and other advantages and in accordance with the purpose of the invention, as embodied and broadly described herein, the invention provides a method of forming buried bit lines. A silicon-on-insulator (SOI) substrate is provided. The SOI substrate includes a silicon substrate, a first insulation layer over the silicon substrate and an epitaxial silicon layer over the first insulation layer. A shallow trench isolation (STI) layer that contacts the first insulation layer is formed in the epitaxial silicon layer. A patterned bit line mask layer is formed over the epitaxial silicon layer such that a portion of the STI layer is exposed. Using the patterned bit line mask layer as a mask, a trench is formed in the substrate. The trench penetrates the STI layer and runs deep into the first insulation layer. A buried bit line is formed inside the trench such that the top surface of the buried bit line is located between the upper and the lower surface of the STI layer. A second insulation layer is next formed over the buried bit line such that the top surface of the second insulation layer is at the same level as the top surface of the epitaxial silicon layer. The patterned bit line mask layer is removed. A plurality of word lines and a plurality of source/drain regions are formed above the substrate and the epitaxial silicon layer, respectively. A third insulation layer is formed over the substrate, filling the space between the word lines such that the top surface of the third insulation layer is at the same level as the top surface of the bit lines. A self-aligned contact process is carried out, forming bit line contact openings between the word lines. The bit line contact opening exposes the buried bit line and a portion of the source/drain region. Finally, bit line contact is formed in the bit line contact opening so that the bit line is electrically connected to the buried bit line and the source/drain region.

In this invention, because the buried bit line opening runs deep into the first insulation layer of the silicon-on-insulator substrate, a rather thick buried bit line can be formed in the substrate. Hence, electrical resistance of the buried bit line can be greatly reduced. In addition, since the buried bit line only reaches the first insulation layer in the silicon-on-insulator substrate, leakage of current between the buried bit line and the substrate material is prevented due to complete isolation by the insulation layer. Furthermore, since the buried bit line is formed in the substrate, the aspect ratio of subsequently formed node contact opening is lowered considerably. Therefore, step coverage of conductive layer inside the node contact opening will improve. Moreover, the processing steps can be carried out using existing equipment, and so there is no need to purchase new etching machines or vapor deposition stations.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
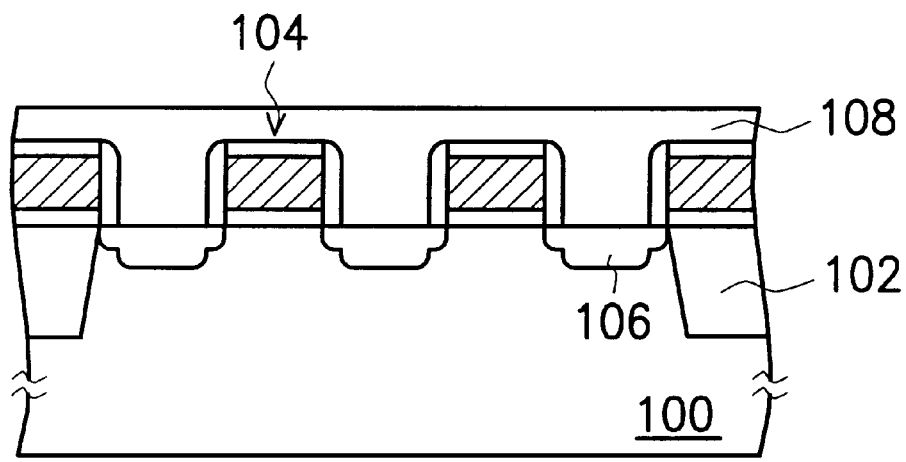
FIGS. 1 through 4 are schematic, cross-sectional views showing the progression of steps for producing a conventional DRAM unit.
Figure 2:
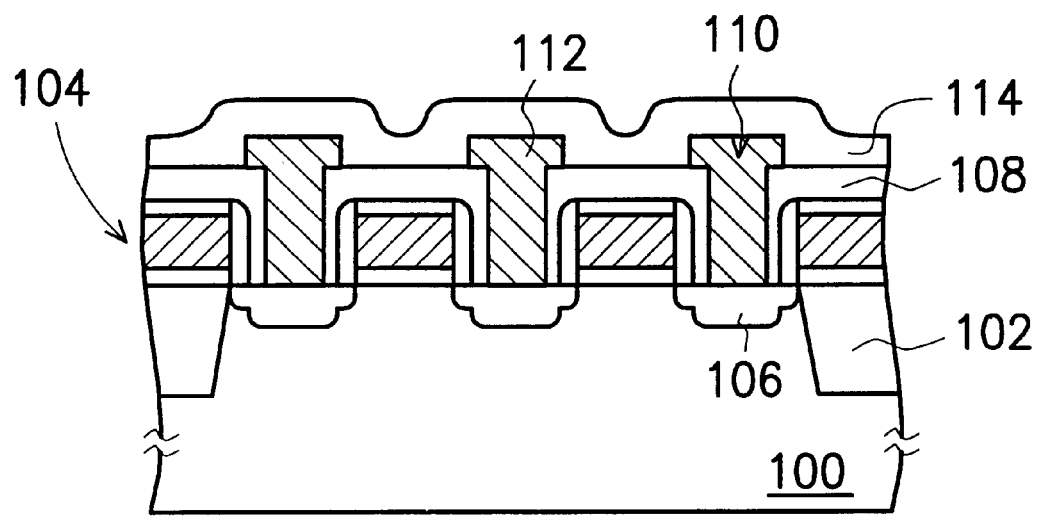
Figure 3:
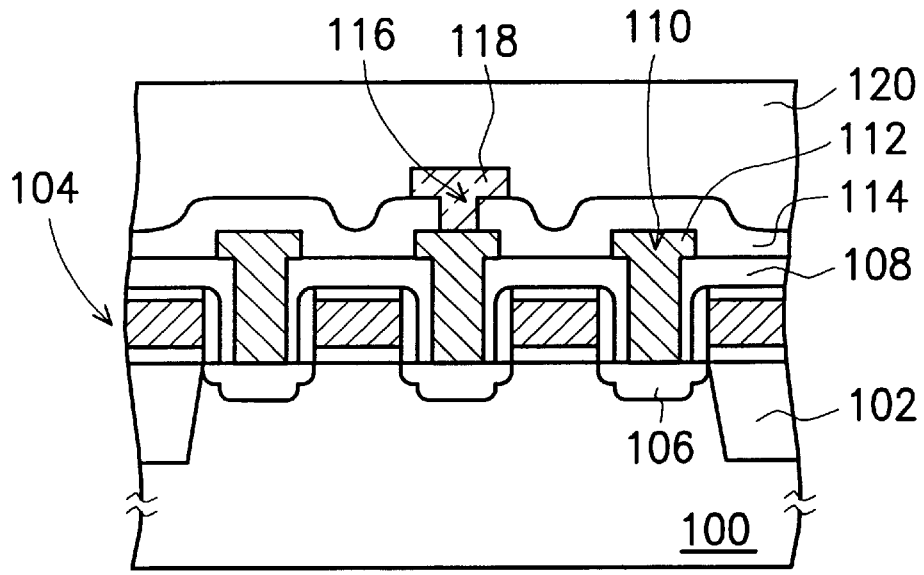
Figure 4:
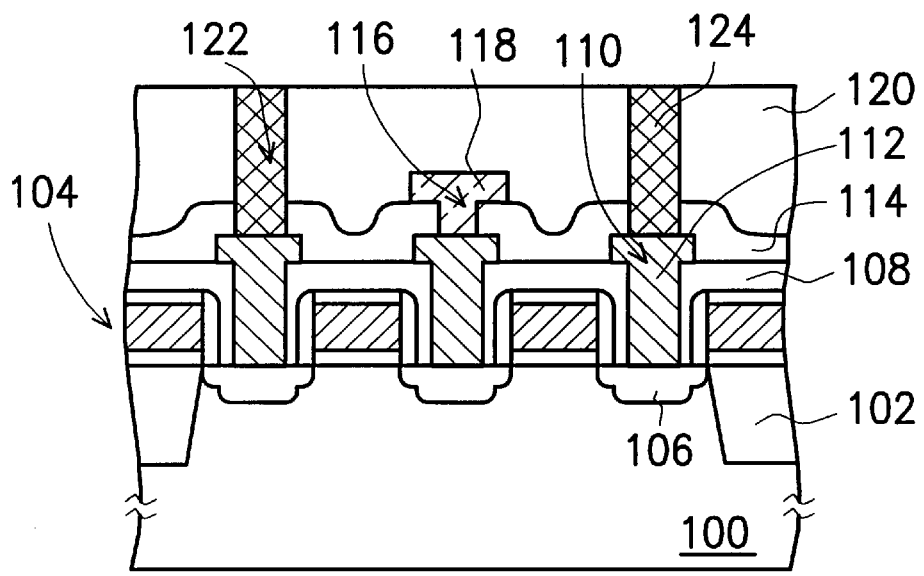

Reference will now be made in detail to the present preferred embodiments of the invention, examples of which are illustrated in the accompanying drawings. Wherever possible, the same reference numbers are used in the drawings and the description to refer to the same or like parts.

FIGS. 5 through 9 are schematic, cross-sectional views showing the progression of steps for producing a buried bit line in a shallow trench isolation according to one preferred embodiment of this invention. FIG. 7A is a cross-sectional view of FIG. 7 along line I—I. FIG. 8A is a cross-sectional view of FIG. 8 along line I—I. FIG. 9A is a cross-sectional view of FIG. 9 along line III—III; and FIG. 9B is a cross-sectional view of FIG. 9A along line IV—IV.

Figure 5:
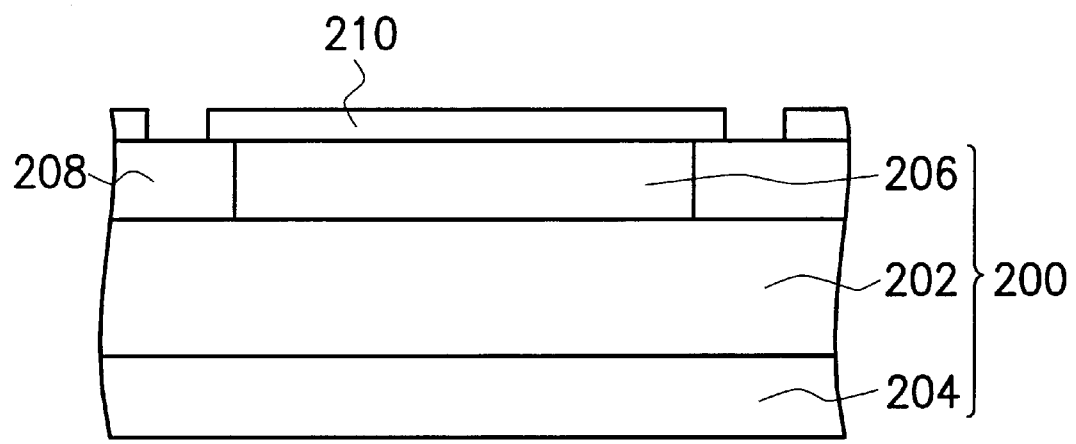
FIGS. 5 through 9 are schematic, cross-sectional views showing the progression of steps for producing a buried bit line in a shallow trench isolation according to one preferred embodiment of this invention.

First, as shown in FIG. 5, a silicon-on-insulator (SOI) substrate 200 is provided. The SOI substrate 200 is formed by coating an insulation layer 202 over a conventional silicon substrate 204 before forming an epitaxial silicon layer 206 so that the silicon substrate 204 and the epitaxial silicon layer 206 are isolated. The insulation layer 202 is preferably a silicon oxide layer. Since the terminals and wells in the device-forming regions are separated from the substrate 204, device latching is prevented. A shallow trench isolation (STI) layer 208 is formed in the epitaxial silicon layer 206. The bottom part of each STI layer 208 contacts the insulation layer 202. A patterned bit line mask layer 210 is formed over the epitaxial silicon layer 206 such that a portion of the STI layer 208 is exposed. The patterned bit line mask layer 210 can be formed using material such as silicon nitride.

Figure 6:
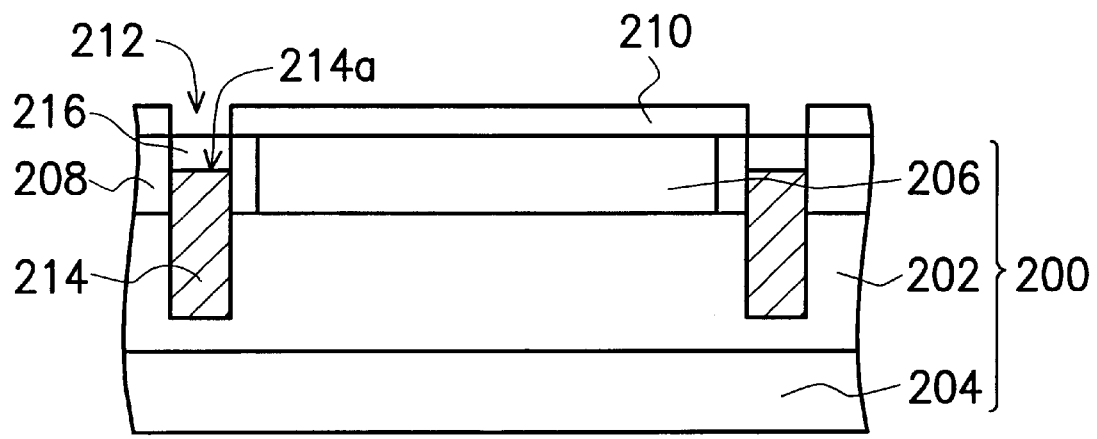

As shown in FIG. 6, the mask layer 210 is used as a mask for forming a deep trench 212 in the insulation layer 202. A buried bit line 214 is formed inside the trench 212 such that the upper surface 214a of the buried bit line 214 is located between the upper and lower surface of the STI layer 208. The buried bit line 214 is preferably formed by depositing conductive material into the trench 212, planarizing the conductive layer (not shown) to remove the conductive layer above the mask layer 210, and finally etching back the conductive layer. The planarization can be carried out by chemical-mechanical polishing. In addition, the buried bit line 214 can be formed using material such as polysilicon or tungsten.

Since the buried bit line 214 is formed in the substrate 200 instead of above the word line, a thicker bit line can be formed to lower bit line resistance. Furthermore, current leaks between the buried bit line 214 and the substrate 204 are avoided because the buried bit line 214 is surrounded by the insulation layer 202.

An insulation layer 216 that fills the remaining space of the trench 212 is formed above the buried bit line 214. The buried bit line 214 is enclosed by the STI layer 208, the insulation layer 216 and the insulation layer 202. The insulation layer 216 is preferably formed by depositing insulation material into the trench 212 to form an insulation layer (not shown). A planarization such as chemical-mechanical polishing is next carried out to remove the insulation layer above the mask layer 210. Finally, the conductive layer is etched back so that the top of the insulation layer is at the same level as the top of the epitaxial silicon layer 206. The insulation layer 216 can be a silicon oxide layer, for example.

Figure 7:
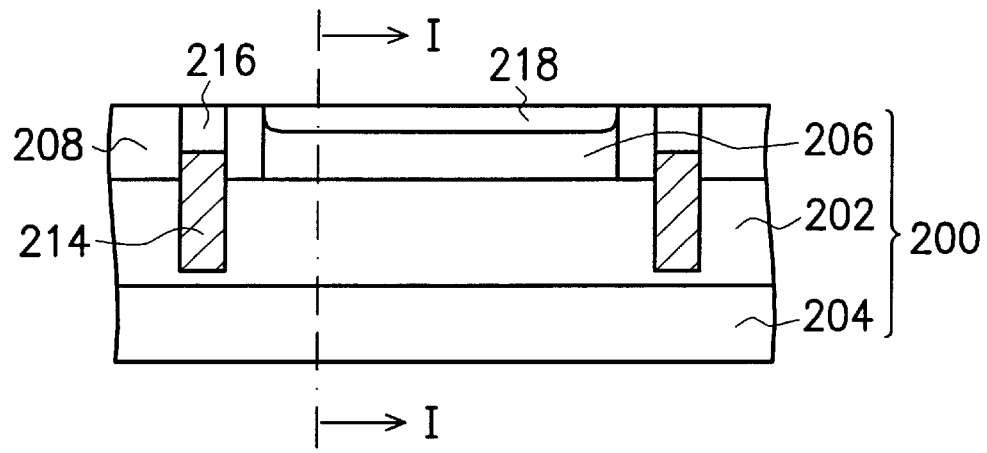
Figure 7A:
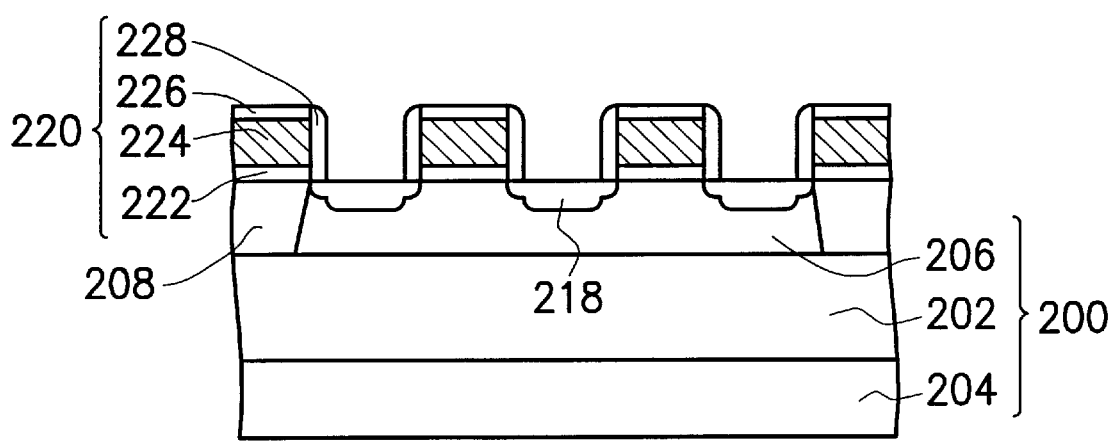
FIG. 7A is a cross-sectional view of FIG. 7 along line I—I.

As shown in FIGS. 7 and 7A, the patterned mask layer 210 is removed using phosphoric acid in a wet etching, for example. An oxide layer (not shown), a conductive layer (not shown) and an insulation layer (not shown) are sequentially deposited over the substrate 200. The oxide layer, the conductive layer and the insulation layer are patterned to form an insulation layer 226, a conductive layer 224 and an oxide layer 222, respectively. A portion of the insulation layer 216, a portion of the STI layer 208 and a portion of the epitaxial silicon layer 206 are also exposed after the patterning process. The conductive layer 224 can be a metal silicide layer and preferably a tungsten silicide layer, while the insulation layers 226 can be a silicon nitride layer, for example.

An ion implantation is carried out implanting ions into the exposed epitaxial silicon layer 206 to form lightly doped regions (not shown). Spacers 228 are formed on the sidewalls of the insulation layer 226, the conductive layer 224 and the oxide layer 222. The spacers 228 can be formed from, for example, silicon nitride. The insulation layer 226, the conductive layer 224, the oxide layer 222 and the spacers 228 together constitute a word line 220. Using the word line 220, the STI layer 208 and the insulation layer 216 as a mask, a second ion implantation is carried out. Ultimately, source/drain regions 218 having a lightly doped drain (LDD) structure are formed in the exposed epitaxial silicon layer 206.

Figure 8:
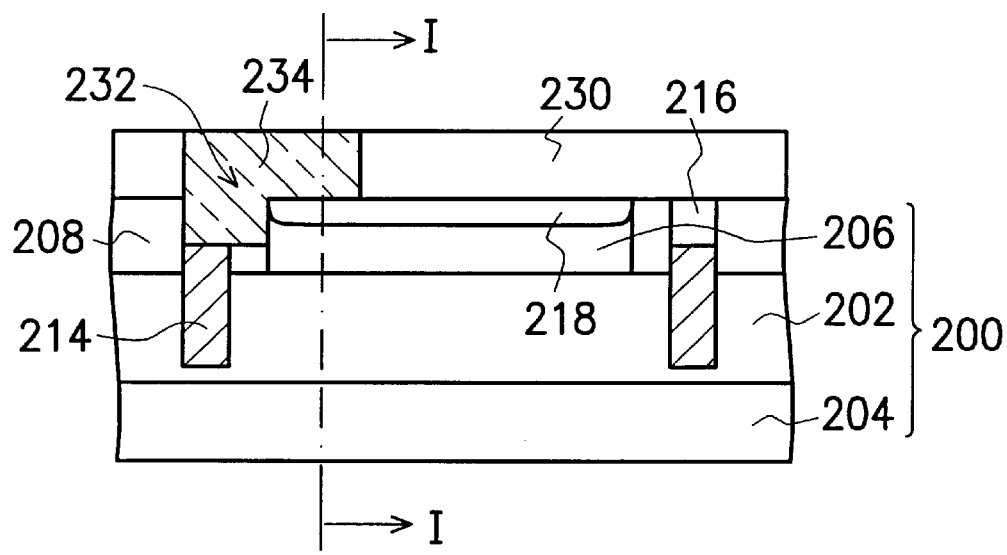
Figure 8A:
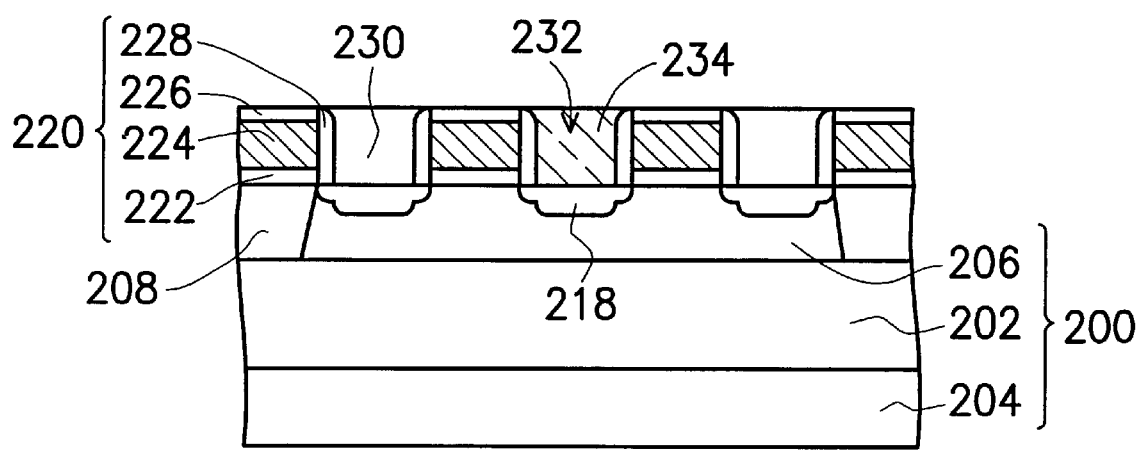
FIG. 8A is a cross-sectional view of FIG. 8 along line I—I.

As shown in FIGS. 8 and 8A, an insulation layer 230 is formed in the space between the neighboring word lines 220. The insulation layer 230 is preferably formed by depositing insulation material into the space between neighboring word lines 220 to form an insulation layer (not shown). The insulation layer above the word lines 220 is then removed by, for example, chemical-mechanical polishing. A self-aligned contact (SAC) process is carried out to remove a portion of the insulation layer 230, a portion of the insulation layer 216 above the buried bit line 214 and a portion of the STI layer 208. Hence, a bit line contact opening 232 that exposes the buried bit line 214 and a portion of the source/drain region 218 is formed in the insulation layer 230. A bit line contact 234 is formed inside the bit line contact opening 232. The bit line contact 234 can be a polysilicon or metal silicide layer preferably formed by depositing conductive material into the bit line contact opening 232 to form a conductive layer (not shown), and then removing a portion of the conductive layer to expose the word line 220 and the insulation layer 230. The conductive layer can be removed by, for example, chemical-mechanical polishing or etching. Since the bit line contact opening 232 exposes a portion of the source/drain region 218 and the buried bit line 214, the source/drain region 218 and the buried bit line contact 214 are electrically connected after the bit line contact 234 is formed.

Figure 9:
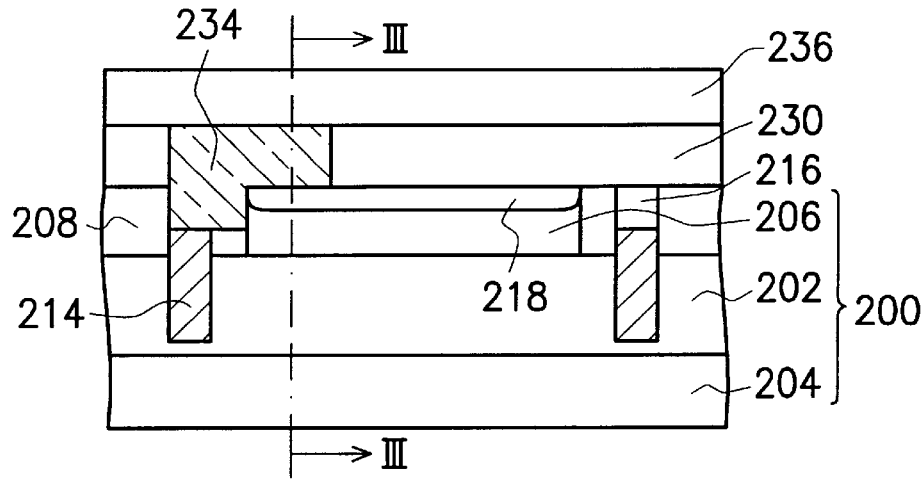
Figure 9A:
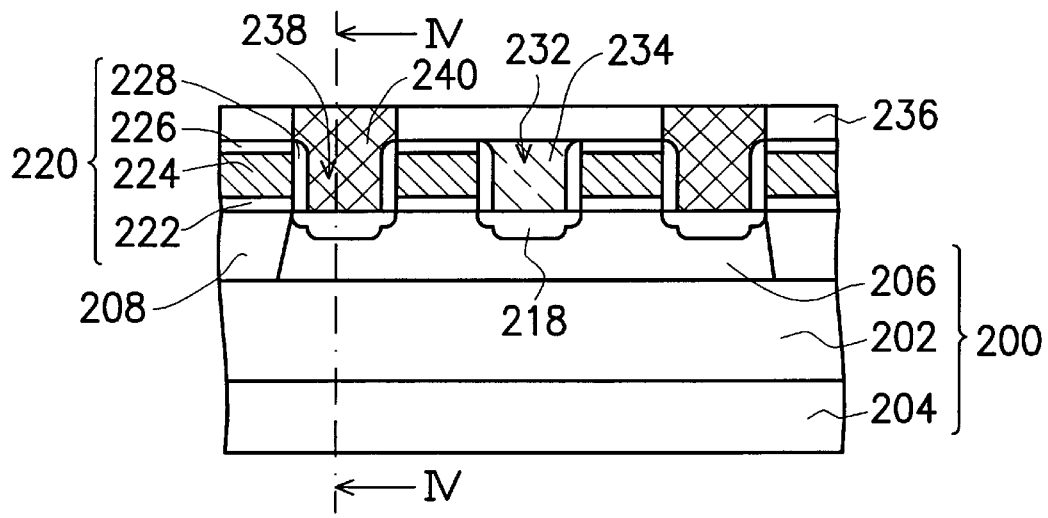
FIG. 9A is a cross-sectional view of FIG. 9 along line III—Ill.
Figure 9B:
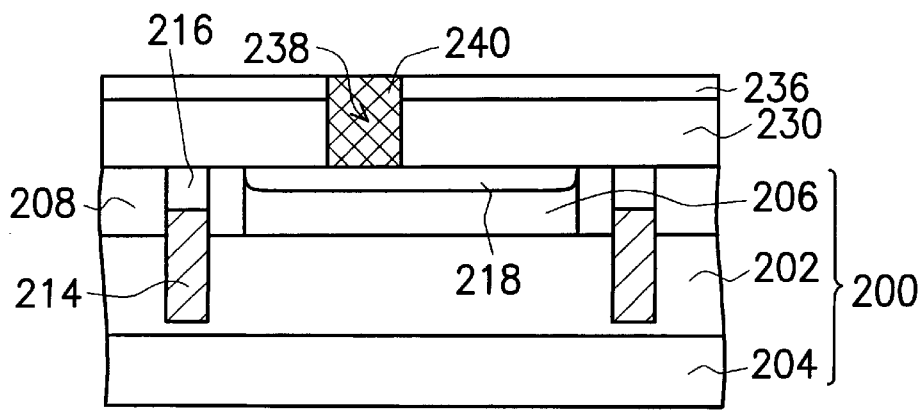
FIG. 9B is a cross-sectional view of FIG. 9A along line IV—IV.

As shown in FIGS. 9, 9A and 9B, a planarized insulation layer 236 is formed over the substrate 200. The planarized insulation layer 236 is preferably formed by depositing insulation material over the substrate to form an insulation layer (not shown), and then planarizing the insulation layer by chemical-mechanical polishing.

A self-aligned contact process is carried out to form a node contact opening 238 through the insulation layers 236 and 230. The node contact opening 238 exposes a portion of the source/drain region 218. A node contact 240 is formed inside the node contact opening 238. The node contact 240 can be formed by, for example, depositing polysilicon into the node contact opening 238 to form a conductive layer (not shown), and then removing a portion of the conductive layer to expose the top surface of the insulation layer 236. The conductive layer can be removed by, for example, chemical-mechanical polishing or etching. Lastly, a capacitor (not shown) is subsequently formed above the substrate 200 to complete the fabrication of a DRAM unit. Since conventional steps are used to form the capacitor over the substrate, detailed descriptions are not omitted here.

In this invention, the buried bit line 214 is embedded inside the substrate 200. Moreover, the number of dielectric layers is reduced. Hence, the node contact opening 238 has a smaller aspect ratio. When a node contact 240 is formed inside the node contact opening 238, a better step coverage of the conductive layer is obtained. Consequently, there is no need to purchase expensive etchers and chemical deposition stations to overcome problems that conventionally arise from a high aspect ratio of node contact opening and poor step coverage of conductive layer.

In summary, the advantages of the invention at least includes:

1. The buried bit line is embedded deep within the SOI substrate. Hence, a thicker bit line can be formed to lower electrical resistance and increase bit line performance.
2. Leakage current between the buried bit line and the silicon substrate is prevented because the buried bit line only reaches deep into the insulation layer above the silicon substrate.
3. Since fewer of dielectric layers are used, the node contact opening only passes through a few dielectric layers. Therefore, aspect ratio of the node contact opening is greatly reduced. Hence, when a node contact is formed inside the node contact opening, step coverage of the deposited conductive layer is greatly improved.
4. There is no need to purchase expensive etchers and chemical deposition stations just to overcome high aspect ratio and step coverage problems. Existing equipment can be used.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a buried bit line, comprising the steps of:

providing a silicon-on-insulator substrate, wherein the substrate includes a silicon base layer, a first insulation layer over the silicon base and an epitaxial silicon layer over the first insulation layer;

forming a shallow trench isolation (STI) layer in the epitaxial silicon layer, wherein a lower surface of the STI layer contacts the first insulation layer;

forming a patterned bit line mask layer over the epitaxial silicon layer, wherein the mask layer exposes a portion of an upper surface of the STI layer;

forming a trench that passes through the STI layer and runs deep into the first insulation layer, while using the patterned bit line mask layer as an etching mask;

forming a buried bit line inside the trench, wherein the top surface of the buried bit line is at a level between the upper and the lower surfaces of the STI layer;

forming a second insulation layer above the buried bit line, wherein the second insulation layer completely fills the trench;

removing the patterned bit line mask layer;

forming a plurality of word lines and a plurality of source/drain regions above the substrate and in the epitaxial silicon layer;

forming a third insulation layer above the substrate, wherein the third insulation layer fills a space between neighboring word lines;

performing a self-aligned contact process to form a bit line contact opening between neighboring word lines, wherein the bit line contact opening exposes a portion of the buried bit line and a portion of the source/drain region; and forming a bit line contact inside the bit line contact opening, wherein the bit line contact is electrically connected to the buried bit line and the source/drain region.

2. The method of claim 1, wherein the step of forming the buried bit line includes the substeps of:

depositing conductive material into the trench and over the substrate to form a conductive layer;

performing a chemical-mechanical polishing operation to remove a portion of the conductive layer and expose a top surface of the patterned bit line mask layer; and etching to remove a portion of the conductive layer inside the trench to form a conductive layer with a top surface at a level between the upper and the lower surface of the STI layer.

3. The method of claim 1, wherein material for forming the patterned bit line mask layer includes silicon nitride.

4. The method of claim 1, wherein the step of forming the second insulation layer includes the substeps of:

depositing insulating material over the substrate and into the trench over the buried bit line to form an insulation layer;

performing a chemical-mechanical polishing operation to remove a portion of the insulation layer and expose the top surface of the patterned bit line mask layer; and etching to remove a portion of the insulation layer so that a top of the remaining insulation layer is at the same level as a top surface of the epitaxial silicon layer.

5. The method of claim 1, wherein the step of removing the patterned bit line mask layer includes using phosphoric acid in a wet etching operation.

6. A method for forming a buried bit line inside a shallow trench isolation (STI) layer, comprising the steps of:

providing a silicon-on-insulator substrate, wherein the substrate includes a silicon base material, a first insulation layer over the silicon base and an epitaxial silicon layer over the first insulation layer;

forming a STI layer in the epitaxial silicon layer, wherein the lower surface of the STI layer contacts the first insulation layer;

forming a patterned silicon nitride layer over the epitaxial silicon layer, wherein the mask layer exposes a portion of an upper surface of the STI layer;

forming a trench that passes through the STI layer and runs deep into the first insulation layer, while using the patterned silicon nitride layer as an etching mask;

depositing conductive material into the trench and over the substrate to form a conductive layer;

performing a chemical-mechanical polishing operation to remove a portion of the conductive layer and expose a top surface of the patterned silicon nitride layer;

etching to remove a portion of the conductive layer inside the trench to form a buried bit line with a top surface at a level between the upper and the lower surfaces of the STI layer;

forming a second insulation layer above the buried bit line, wherein the second insulation layer completely fills the trench;

removing the patterned silicon nitride layer;

forming a plurality of word lines and a plurality of source/drain regions above the substrate and in the epitaxial silicon layer;

forming a third insulation layer above the substrate, wherein the third insulation layer fills a space between neighboring word lines;

performing a self-aligned contact process to form a bit line contact opening between neighboring word lines, wherein the bit line contact opening exposes a portion of the buried bit line and a portion of the source/drain region; and forming a bit line contact inside the bit line contact opening, wherein the bit line contact is electrically connected to the buried bit line and the source/drain region.

7. The method of claim 6, wherein the step of forming the second insulation layer includes the substeps of:

depositing insulating material over the substrate and into the trench over the buried bit line to form an insulation layer;

performing a chemical-mechanical polishing operation to remove a portion of the insulation layer and expose the top surface of the patterned silicon nitride layer; and etching to remove a portion of the insulation layer so that a top of the remaining insulation layer is at the same level as a top surface of the epitaxial silicon layer.

8. The method of claim 6, wherein the step of removing the patterned silicon nitride layer includes using phosphoric acid in a wet etching operation.

* * * * *